United States Patent [19]
Takasu

[11] Patent Number: 4,633,280
[45] Date of Patent: Dec. 30, 1986

[54] UNIT OF LIGHT EMITTING DIODE ARRAYS

[75] Inventor: Hiromi Takasu, Tottori, Japan

[73] Assignees: Sanyo Electric Co., Ltd.; Tottori Sanyo Electric Co., Ltd., both of Japan

[21] Appl. No.: 753,393

[22] Filed: Jul. 10, 1985

[30] Foreign Application Priority Data

Jul. 20, 1984 [JP] Japan ................... 59-151722

[51] Int. Cl.⁴ ............................. H01L 33/00
[52] U.S. Cl. ........................... 357/17; 357/16; 357/20; 357/45; 357/65; 313/500
[58] Field of Search ............... 357/17, 16, 45, 65, 357/68, 20; 313/498, 499, 500, 510; 354/5, 12

[56] References Cited
U.S. PATENT DOCUMENTS 3,850,517 11/1974 Stephany et al. ............. 354/12
4,145,707 3/1979 Sadamasa et al. ............. 357/65

Primary Examiner—James W. Davie
Assistant Examiner—Georgia Y. Epps
Attorney, Agent, or Firm—Darby & Darby

[57] ABSTRACT

A unit of light emitting diode arrays in accordance with the present invention comprises a main body (21) of n-GaAs, layers (22) and (23) of n-GaAsP formed on the main body and a plurality of light emitting regions (24) formed in a line by diffusion of Zn on the surface of the layers. Each of the light emitting regions (24) has a rectangular shape and contains a protruding portion (241). In the direction intersecting at right angles with the light emitting regions (24) formed in a line, electrodes (25) are provided alternately. These electrodes (25) are formed by evaporation and photolithography to cover the respective protruding portions (241) so as to be in ohmic contact. Thus, since the electrodes (25) are formed to cover the protruding portions (241) of the light emitting regions (24), a printing dot of a desired shape can be formed and accordingly, the quality of printing can be improved and an arrangement of a high density of printing dots can be made.

13 Claims, 8 Drawing Figures

UNIT OF LIGHT EMITTING DIODE ARRAYS

BACKGROUND OF THE INVENTION

1. Field of the Invention

The present invention relates to a unit of light emitting diode arrays. More particularly, the present invention relates to a unit of light emitting diode arrays to be used in an optical print head and the like, in which a large number of light emitting arrays are provided on a substrate.

2. Description of the Prior Art

In the prior art, U.S. Pat. No. 3,850,517 to Joseph F. Stephany, "High Speed Printout System" is known as an optical printer using light emitting diode arrays as a light source. As light emitting diode arrays to be used in such an optical printer, Japanese Patent Laying-Open Gazette No. 125878/1983, "Light Emitting Device Fixing Substrate" invented by Takeshi Mizutani et al. and Japanese Patent Laying-Open Gazette No. 22372/1984, "Semiconductor Light Emitting Device" invented by Tsutomu Koshimura are known.

FIG. 1 is a perspective appearance view showing an example of a conventional light emitting device in which the "Light Emitting Device Fixing Substrate" of the above stated Japanese patent Laying-Open Gazette No. 125878/1983 is applied.

First, referring to FIG. 1, a light emitting device 1 to be used in a conventional optical printer will be described. The light emitting device 1 comprises a substrate 2 and a large number of light emitting diode arrays 4 having a large number of light emitting areas 3 provided on the substrate 2. Electrodes 5 are formed corresponding to the respective light emitting diode arrays 4 and each electrode 5 is connected through a metallic fine wire 6 to a fine pattern 7 formed in the vicinity of the light emitting diode arrays 4.

FIG. 2 is a sectional view of an essential portion of a conventional light emitting diode array and FIG. 3 is a plane view of the essential portion.

Each of the light emitting diode arrays 4 shown in FIG. 1 includes a P type region 10 formed by selectively diffusing a P type dopant using a mask, an insulating film 8 having an opening 81 on an n type layer 9 of GaAsP and an electrode 5 of aluminum is formed to cover partially the P type region 10.

The electrode 5 has a top end 51 of a width equal to the length of one side of the opening 81 of the insulating film 8, as shown in FIG. 3. Thus, since the electrode 5 can be formed by using one side of the opening 81 of the insulating film 8 as a reference line, positioning of a mask having an electrode pattern can be made easily at the time of evaporation of the electrode 5.

Therefore, a method to form an electrode 51 having a top end of the same width as that of a P type region 10 as shown in FIG. 3 may be considered. This method makes it possible to set a mask for electrodes by using the side edges of the P type region 10 as reference lines and thus, positioning can be made easily.

However, if a P type region 10 assigned for a light emitting region is formed by diffusion on the n type layer 9 as show in FIG. 2, the diffused layer, that is, the P type region 10 becomes wider as it comes up to the surface of the n type layer 9, and thus, this P type region 10 has a sectional shape like a saucer due to such enhanced diffusion. Further, light from the P type region 10 is emitted not only perpendicularly to the surface but also radially. Accordingly, if electric current is supplied to the Pn junction to emit light, expansion of the P type region 10 due to such spreading diffusion and enlargement of the luminous flux cause light to be emitted with an area larger than the area of the opening 81 of the insulating film 8 by 2 to 10% as a whole.

On the other hand, since the electrode 5 of aluminum has naturally the light intercepting property, the light emitted from the surface of the P type region 10 located under the electrode 5 is intercepted. However, the light from the portions spread by the diffusion leaks from both sides of the electrode 51 and as a result, the dot shape corresponds to a printing dot in the shape almost like the letter U as shown by the shaded portion in FIG. 3. Since the depth of the P type region 10 is as shallow as 5.0 μm (generally, approximately 2.0 μm), the rays of light around the electrode 51 do not cause any serious influence when the density of printing dots is low (for example, the density is 3.85 dots/mm and the width of a printing dot is less than 50% of a spacing of dots). However, if the density of printing dots is high (for example, 9.5 dots/mm or more), the rays of light around the electrode 51 become conspicuously bright and particularly the Pn junction under the electrode 51 is liable to have high brightness since electric current tends to concentrate in the Pn junction. In consequence, a drawback is involved that if electric current higher than 8 mA/dot flows, the printing dots have a shape nearly coincident to the letter U and thus, the printing quality is deteriorated.

On the other hand, the above mentioned Japanese Patent Laying-Open Gazette No. 22372/1984, "Semiconductor Light Emitting Device" discloses the use of an electrode having a top end in the shape of the letter U so as to cover at least three sides of a P type region. Thus, the above stated rays of light can be intercepted by making an electrode surround the P type region or making a sufficiently wide electrode cover one side of the P type region. However, such shape of an electrode makes it difficult to arrange a high density of electrodes. More specifically, positioning of a mask for forming electrodes cannot be made easily and deviation is liable to occur in the position of the electrode pattern. As a result, an electrode in a P type region comes too close to the adjacent P type region or adjacent electrode, which often causes erroneous emission of light or a short circuit due to leakage of electric current. Accordingly, there is a disadvantage that the printed picture quality is rough since P type regions for forming printing dots must be disposed with a sufficient spacing.

SUMMARY OF THE INVENTION

Therefore, a primary object of the present invention is to provide a unit of light emitting diode arrays having an excellent quality of printing, which can be manufactured easily and is most suitably utilized as a print head of an optical printer.

Briefly stated, in the present invention, a plurality of light emitting regions of a second conductive type each having a protruding portion are formed on the surface of a substrate of a first conductive type so as to emit light corresponding to a dot shape and light intercepting electrodes are formed in ohmic contact to cover the respective protruding portions of the second conductive type.

Thus, according to the present invention, a protruding portion is formed in a portion of each light emitting region and an electrode is formed in a portion of each light emitting region and an electrode is formed to cover partially the protruding portion, which makes it possible to make clear the light emitted from each light emitting region corresponding to a dot shape. Further, since it is not needed to widen unnecessarily the top end of each electrode on the side of the associated light emitting region, adaptation for a high density of printing dots can be made and reference lines can be easily determined for positioning of a mask for electrodes. Consequently, manufacturing can be made easily.

In a preferred embodiment of the present invention, a main body is formed of GaAs and layers of n-GaAsP are formed thereon so that a substrate of n-GaAsP is formed. Then, by diffusion of Zn on the surface of the substrate, light emitting regions are formed.

Further, in a more preferred embodiment of the present invention, light emitting regions are formed to be arrayed in a line, each having a shape corresponding to a dot shape in the rectangular, parallelogram or round shape. Electrodes are disposed alternately to the right and to the left of the light emitting regions arrayed in a line, in the direction intersecting at right angles with the thus arrayed light emitting regions. Consequently, the respective adjacent electrodes will never be too close to each other and the degree of integration can be improved.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
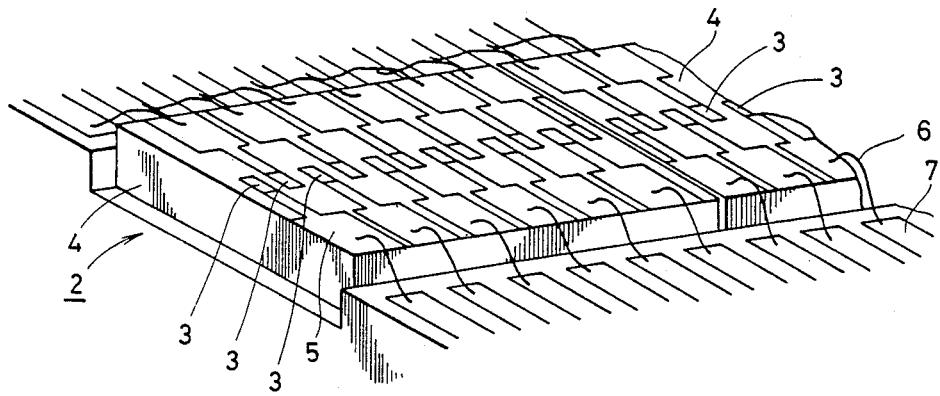
FIG. 1 is a perspective view of an essential portion of an optical print head where a conventional unit of light emitting diode arrays is provided.
Figure 2:
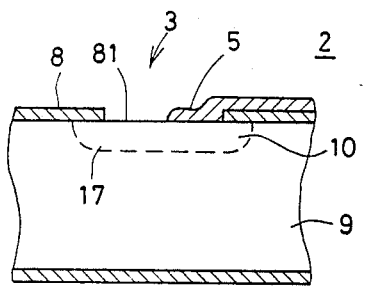
FIG. 2 is a sectional view of an essential portion of a conventional unit of light emitting diode arrays.
Figure 3:
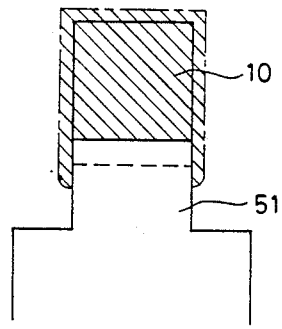
FIG. 3 is a plane view of an essential portion of a conventional unit of light emitting diode arrays.
Figure 4:
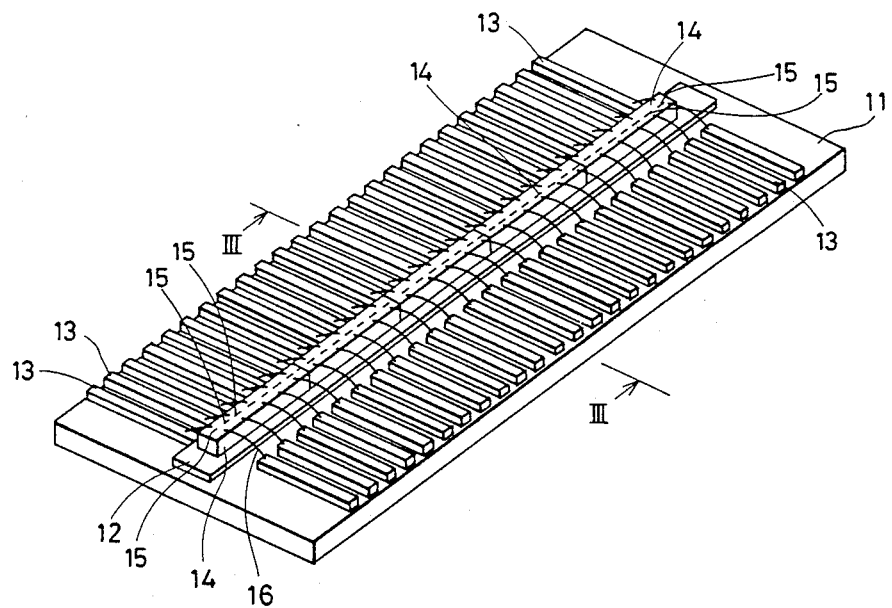
FIG. 4 is a perspective appearance view of an optical printer head where a unit of light emitting diode arrays in accordance with an embodiment of the present invention is applied.

FIG. 4 is a perspective appearance view of an optical printer head where a unit of light emitting diode arrays in accordance with an embodiment of the present invention is applied. First, referring to FIG. 4, description will be given to the construction of an optical print head where a unit of light emitting diode arrays in accordance with an embodiment of the present invention is applied. On a substrate 11, an elongate printed conductor 12 is formed. This elongate printed conductor 12 is formed so that both longer sides thereof are parallel straight lines, which serve as reference lines for positioning a plurality of light emitting diode arrays 14. If a unit of light emitting diode arrays in this embodiment is applied to an optical print head for printing letters and the like on the printing paper of A4 size, the elongate printed conductor 12 is formed to have a width of 1.4 mm and a length of 220 mm for example.

A light emitting diode array 14 includes a plurality of light emitting areas 15. More specifically, a light emitting diode array 14 having a length of 8 mm for example is obtained in a manner in which a PN junction is formed on GaAsP by selective diffusion and 64 light emitting areas 15 for example are arrayed. A plurality of such light emitting diode arrays 14 are disposed on the elongate printed conductor 12. In the vicinity of the elongate printed conductor 12, fine patterns 13 are formed. The light emitting diode arrays 14 are connected to the fine patterns 13 through metallic fine wires 16 by a wire bonding method or the like.

Figure 5:
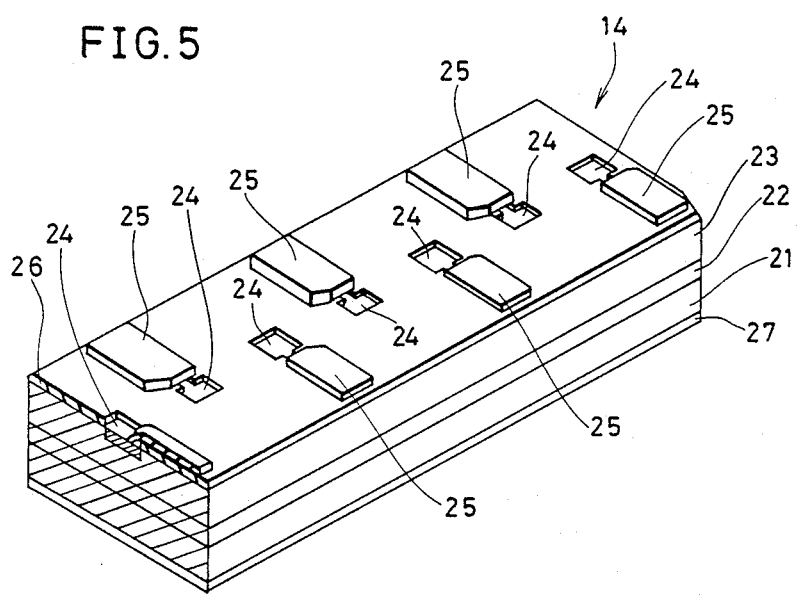
FIG. 5 is a perspective view of a unit of light emitting diode arrays in accordance with an embodiment of the present invention.
Figure 6:
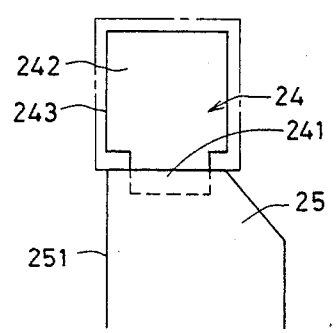
FIG. 6 is a plane view of an essential portion of an embodiment of the present invention.

FIG. 5 is a perspective view of a unit of light emitting diode arrays in accordance with an embodiment of the present invention and FIG. 6 is a plane view of an essential portion of this embodiment of the present invention.

Now, referring to FIGS. 5 and 6, an embodiment of the present invention will be described in more detail. As shown in FIG. 5, on the n type GaAs main body having a thickness of 300 $\mu$m, a GaAsP layer 22 of 50 $\mu$m in thickness, which compound ratio changes gradually from GaAs to the main body to GaAs$_{0.6}$P$_{0.4}$ and a GaAs$_{0.6}$P$_{0.4}$ layer 23 of 30 $\mu$m in thickness are formed by vapor phase epitaxial growth. A mixed crystal ratio of GaAs and GaP of the layer 23 is selected according to the photosensitive characteristic of a photosensitive material (not shown); for example, the mixed crystal ratio is 0.6, that is, GaAs$_{0.6}$P$_{0.4}$ in the case of an amorphous silicon photosensitive material which has the maximum sensitivity at 660 nm. Then, a Si$_3$N$_4$ insulating film 26 having an opening 24 is formed on the GaAs$_{0.6}$P$_{0.4}$ layer 23. This opening 81 has a square base portion 242 and a protruding portion 241 formed on one side of the base portion 242. Using the insulating film 26 as a mask, a P type impurity, for example, Zn is selectively diffused on the surface of the GaAs$_{0.6}$P$_{0.4}$ layer 23 so as to form a P type region 24 of 2 to 5 $\mu$m in thickness having an impurity concentration of $\simeq 10^{19}$/cm$^3$.

Further, on this insulating film 26 or a newly provided equivalent insulating film a light intercepting electrode 25 of aluminum is formed. This electrode 25 is positioned so that a lateral side thereof may be aligned with the lateral side 243 of the opening 81. One end of the electrode 25 covers most part of the protruding portion 241 of the P type region 24 so as to be in ohmic contact with the P type region 24. On the back surface of the main body 21 of GaAs, a whole surface electrode 27 of Au-Sn-Te alloy or the like is formed.

More specifically stated by taking an further example, a diffusion mask pattern for light emitting regions 24 includes squares of 50 $\mu$m as one side provided respectively with a protruding portion 241 having a length of 20 $\mu$m and a width of 40 $\mu$m. These squares are disposed with the density of 300 dots/inch and selective diffusion of Zn is applied with a depth of 2.5 $\mu$m. After that, electrodes 25 are arranged with a spacing of 2 $\mu$m from the respective base portions 242 of the light emitting regions 24 so that electrodes are formed in ohmic contact with the P type region. The light emitting area formed by the thus exposed P type region 24 has an almost square shape one side of which has a small protruding portion. Then, if electric current of 5 mA/dot flows, an almost square printing dot having each side of 52 μm can be obtained and if electric current of 10 mA/dot flows, an almost square printing dot having each side of 55 μm can be obtained.

If a size is changed to increase the density of printing dots, a unit of light emitting diode arrays for printing can be formed with a density up to 400 dots/inch, in which a square printing dot can be obtained to have a width equal to 75% of each spacing of dots. However, with respect to a higher degree of resolution, formation of printing dots cannot be ascertained at present because a high density short focus lens array for analyzing the forms of the printing dots is not available.

Figure 7:
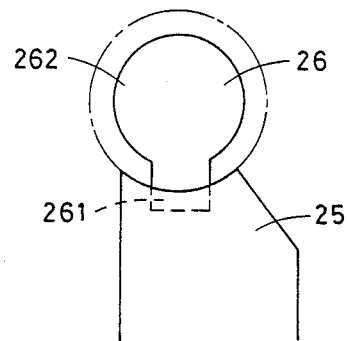
FIG. 7 is a plane view of an essential portion of another embodiment of the present invention.

FIG. 7 is a plane view of an essential portion of another embodiment of the present invention. In the embodiment shown in FIG. 7, an almost circular light emitting area is formed instead of the square light emitting area having a small protruding portion on one side as shown in FIG. 6. Therefore, the P type region 26 is formed using a diffusion mask having an opening comprised of the circular base portion 262 and the protruding portion 261 extending from a portion of the circular base portion 262, so that the electrode 25 is formed to cover most part of the protruding portion 261. Thus, the light emitting area has the almost circular shape and in consequence, the printed dot shape becomes round, which makes it possible for an optical printer apparatus to print a smoother oblique line compared with the case of the almost square light emitting area, that is, the square dot shape shown in FIG. 6.

Figure 8:
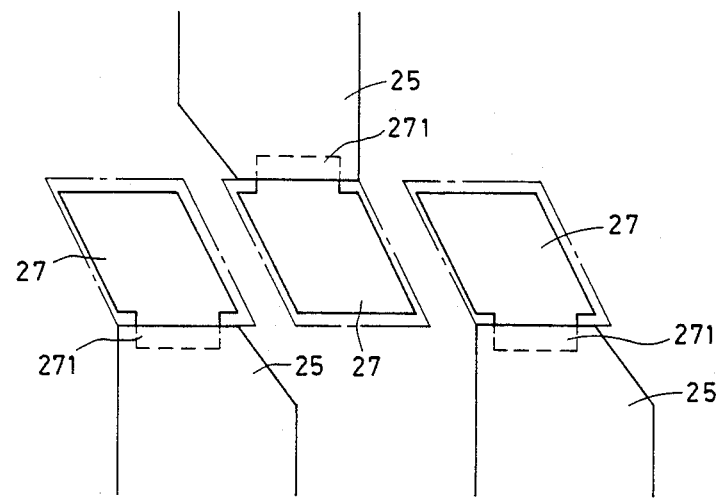
FIG. 8 is a plane view of an essential portion of a further embodiment of the present invention.

FIG. 8 is a plane view of a further embodiment of the present invention. In the embodiment shown in FIG. 8, for the purpose of obtaining a dot shape in parallelogram, the P type region 27 is formed by using a diffusion mask having an opening comprised of a parallelogram shaped base portion 272 and a protruding portion 271 extending from one side of the base portion 272, so that the electrode 25 is formed to cover most part of the protruding portion 271. By thus forming the dot shape in parallelogram, a horizontal straight line can be represented in such a manner as if the printing dots were uninterruptedly connected.

It goes without saying that the present invention is not limited to the above stated square, circular or parallelogram shape and any other dot shape may by applied.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A unit of light emitting diode arrays comprising:
   a substrate of a first conductivity type;
   a plurality of regions of a second conductivity type formed in the surface of said substrate to emit light corresponding to a dot shape, each of said plurality of regions including a dot-shaped portion and a portion protruding laterally to the dot-shaped portion having narrower width than the dot-shaped portion; and
   light intercepting electrodes in ohmic contact covering partially said respective protruding portions of the second conductivity type.

2. A unit of light emitting diode arrays in accordance with claim 1, wherein
   said substrate of the first conductivity type is an n type substrate and said plurality of regions of the second conductive type are P type regions.

3. A unit of light emitting diode arrays in accordance with claim 2, wherein
   said n type substrate is a n-GaAsP substrate.

4. A unit of light emitting diode arrays in accordance with claim 2, wherein
   said n type substrate comprises a main body formed of GaAs and layers of n-GaAsP formed in said main body.

5. A unit of light emitting diode arrays in accordance with claim 1, wherein
   said plurality of regions of the second conductivity type are arrayed in a line.

6. A unit of light emitting diode arrays in accordance with claim 3, wherein
   said plurality of regions of the second conductivity type are formed by diffusion of Zn in said n-GaAsP substrate.

7. A unit of light emitting diode arrays in accordance with claim 4, wherein
   said plurality of regions of the second conductivity type are formed by diffusion of Zn in said n-GaAsP layers.

8. A unit of light emitting diode arrays in accordance with claim 1, wherein
   said dot shape has an square shape having four sides, and
   said plurality of regions of the second conductivity type each correspond to said angular shape and each have one side including said protruding portion.

9. A unit of light emitting diode arrays in accordance with claim 8, wherein
   said square shape is a parallelogram.

10. A unit of light emitting diode arrays in accordance with claim 8, wherein
    said square shape is rectangular.

11. A unit of light emitting diode arrays in accordance with claim 1, wherein
    said dot shape has a circular shape , and
    said plurality of regions of the second conductivity type each correspond to said circular shape and each have a portion including said protruding portion extending therefrom.

12. A unit of light emitting diode arrays in accordance with claim 1, wherein
    said each electrode includes a portion covering said protruding portion so that a light emitting pattern from said each region has a shape similar to said dot shape.

13. A unit of light emitting diode arrays in accordance with claim 1, wherein
    said electrodes are formed to extend alternately in the direction intersecting at right angles with said plurality of regions of the second conductivity type arrayed in a line.

* * * * *